(12) United States Patent
Chang et al.

(10) Patent No.: US 9,425,119 B2
(45) Date of Patent: Aug. 23, 2016

(54) PACKAGE STRUCTURE AND FABRICATION METHOD THEREOF

(71) Applicant: Siliconware Precision Industries Co., Ltd., Taichung (TW)

(72) Inventors: Hong-Da Chang, Taichung (TW); Shih-Kuang Chiu, Taichung (TW)

(73) Assignee: Siliconware Precision Industries Co., Ltd., Taichung (TW)

( * ) Notice: Subject to any disclaimer, the term of this patent is extended or adjusted under 35 U.S.C. 154(b) by 0 days.

(21) Appl. No.: 14/273,952

(22) Filed: May 9, 2014

(65) Prior Publication Data
US 2015/0162264 A1    Jun. 11, 2015

(30) Foreign Application Priority Data

Dec. 11, 2013   (TW) .............................. 102145517 A

(51) Int. Cl.
| | |
|---|---|
| *H01L 23/28* | (2006.01) |
| *H01L 21/768* | (2006.01) |
| *B81B 7/00* | (2006.01) |
| *G01L 19/00* | (2006.01) |
| *G01L 19/14* | (2006.01) |
| *H01L 23/10* | (2006.01) |

(52) U.S. Cl.
CPC ............... *H01L 23/28* (2013.01); *B81B 7/007* (2013.01); *B81B 7/0061* (2013.01); *G01L 19/0076* (2013.01); *G01L 19/147* (2013.01); *B81B 2207/098* (2013.01); *H01L 23/10* (2013.01); *H01L 2224/48091* (2013.01)

(58) Field of Classification Search
CPC ............... H01L 2924/00; H01L 2924/00014; H01L 2924/1461; H01L 2224/48091; H01L 2924/10253; H01L 2924/01079; H01L 2924/01029
USPC .................................................. 257/415, 774
See application file for complete search history.

(56) References Cited

U.S. PATENT DOCUMENTS

| | | | |
|---|---|---|---|
| 2012/0001274 A1* | 1/2012 | Chang et al. ................. | 257/415 |
| 2013/0070951 A1* | 3/2013 | Tanaka et al. ................ | 381/361 |
| 2013/0320463 A1* | 12/2013 | Chang et al. ................. | 257/415 |

* cited by examiner

*Primary Examiner* — Cuong Q Nguyen
*Assistant Examiner* — Tong-Ho Kim
(74) *Attorney, Agent, or Firm* — Mintz Levin Cohn Ferris Glovsky and Popeo, P.C.; Peter F. Corless; Steven M. Jensen

(57) ABSTRACT

A package structure is provided, which includes: a wafer having a surface with a groove, a thin film closing an open end of the groove and electrical contacts; a chip having a surface with a conductive layer and an opposite surface with a concave portion and a seal ring located at a periphery of the concave portion, the chip being disposed on the wafer with the seal ring surrounding the thin film and the electrical contacts located outside the seal ring; an encapsulant formed on the wafer for encapsulating the chip and the electrical contacts; a plurality of sub-conductive wires embedded in the encapsulant with one ends exposed from a top surface of the encapsulant and the other ends in electrical connection with the electrical contacts; and a through hole penetrating the wafer and communicating with the concave portion, thereby reducing the fabrication cost and size of the package structure.

30 Claims, 9 Drawing Sheets

PACKAGE STRUCTURE AND FABRICATION METHOD THEREOF

CROSS-REFERENCES TO RELATED APPLICATIONS

This application claims under 35 U.S.C. §119(a) the benefit of Taiwanese Application No. 102145517, filed Dec. 11, 2013, the entire contents of which is incorporated herein by reference.

BACKGROUND OF THE INVENTION

1. Field of the Invention

The present invention relates to package structures and fabrication methods thereof, and more particularly, to a package structure having a MEMS (Micro-Electro-Mechanical System) element and a fabrication method thereof.

2. Description of Related Art

MEMS elements have integrated electrical and mechanical functions and can be fabricated through various microfabrication technologies. A MEMS element is generally disposed on a substrate and protected by a cover or an encapsulant from being damaged by external environment.

FIG. 1 is a schematic cross-sectional view of a conventional package structure having a MEMS element. Referring to FIG. 1, a MEMS element 11, such as a pressure sensing element, is disposed on an LGA (Land Grid Array) substrate 10, and electrical contacts 111 of the MEMS element 11 are electrically connected to electrical contacts 101 of the LGA substrate 10 by wire bonding. Then, a metal lid 12 is disposed on the substrate 10 to encase the MEMS element 11 therein, thus protecting the MEMS element 11 from being contaminated or damaged by external environment. However, such a package structure has a large size, which fails to meet the miniaturization requirement of end products.

Accordingly, FIG. 2 shows a wafer-level pressure sensing package structure as disclosed by US Patent Application Publication No. 2006/0185429. Referring to FIG. 2, a MEMS element 21, such as a pressure sensing element, is directly fabricated on a silicon substrate 23 and a glass lid 24 is bonded to the MEMS element 21 by anodic bonding.

However, in the silicon substrate 23, a sensing cavity 231 and a plurality of through holes 232 need to be formed. Therefore, a through silicon via (TSV) technique is required, which uses KOH as an etchant to form vias or grooves.

Compared with the previous package structure, the package structure disclosed by US Patent Application Publication No. 2006/0185429 has a greatly reduced size. However, the TSV technique is costly and requires a high degree of accuracy, thereby complicating the fabrication process and increasing the fabrication cost.

Therefore, there is a need to provide a package structure and a fabrication method thereof so as to overcome the above-described drawbacks.

SUMMARY OF THE INVENTION

In view of the above-described drawbacks, the present invention provides a method for fabricating a package structure, which comprises the steps of: preparing a first wafer and a chip disposed on the first wafer, wherein the first wafer has opposite first and second surfaces and the first surface of the first wafer has a groove, a thin film closing an open end of the groove and a plurality of electrical contacts, and the chip has a third surface with a conductive layer and an opposite fourth surface with a concave portion and a seal ring located at a periphery of the concave portion, the chip being disposed on the first surface of the first wafer in a manner that the seal ring surrounds the thin film of the first wafer and the electrical contacts are located outside the seal ring; electrically connecting the electrical contacts of the first wafer and the conductive layer of the chip through a plurality of first conductive wires; forming an encapsulant on the first surface of the first wafer for encapsulating the chip, the electrical contacts and the first conductive wires; removing a portion of the encapsulant and a portion of the first conductive wires from a top surface of the encapsulant so as to form a plurality of sub-conductive wires, wherein one ends of the sub-conductive wires are exposed from the encapsulant and the other ends of the sub-conductive wires are in electrical connection with the electrical contacts of the first wafer; and forming a through hole penetrating the first surface and the second surface of the first wafer and communicating with the concave portion of the chip.

In the above-described method, preparing the first wafer and the chip can comprise: preparing the first wafer and a second wafer disposed on the first wafer; thinning the second wafer; forming the conductive layer on the second wafer; and removing a portion of the second wafer to form the chip.

The present invention provides another method for fabricating a package structure, which comprises the steps of: preparing a first wafer, a chip disposed on the first wafer, and a lid member disposed on the chip, wherein the first wafer has opposite first and second surfaces and the first surface of the first wafer has a groove, a thin film closing an open end of the groove and a plurality of electrical contacts, and the chip has a third surface with a plurality of electrode pads and an opposite fourth surface with a concave portion and a seal ring located at a periphery of the concave portion, such that the chip is disposed on the first surface of the first wafer in a manner that the seal ring surrounds the thin film of the first wafer and the electrical contacts are located outside the seal ring, and the lid member is disposed on the third surface of the chip and has a conductive layer formed on a top surface thereof; electrically connecting the electrical contacts of the first wafer and the conductive layer of the lid member through a plurality of first conductive wires, and electrically connecting the electrical contacts of the first wafer and the electrode pads of the chip through a plurality of second conductive wires; forming an encapsulant on the first surface of the first wafer for encapsulating the chip, the lid member, the electrical contacts, the first conductive wires and the second conductive wires; removing a portion of the encapsulant and a portion of the first conductive wires from a top surface of the encapsulant so as to form a plurality of sub-conductive wires, wherein one ends of the sub-conductive wires are exposed from the encapsulant and the other ends of the sub-conductive wires are in electrical connection with the electrical contacts of the first wafer; and forming a through hole penetrating the first surface and the second surface of the first wafer and communicating with the concave portion of the chip.

In the above-described method, preparing the first wafer and the chip can comprise: preparing the first wafer and a second wafer disposed on the first wafer; thinning the second wafer; and removing a portion of the second wafer to form the chip. Further, the chip can be a motion sensor.

In an embodiment, after forming the through hole, the above-described two methods further comprise performing a singulation process.

After forming the sub-conductive wires, the above-described methods can further comprise forming a redistribution layer on the encapsulant, wherein the redistribution layer is electrically connected to the sub-conductive wires. Before forming the through hole, the above-described methods can further comprise mounting a carrier on the redistribution layer; and after forming the through hole, the above-described methods can further comprise removing the carrier. The carrier can be made of a transparent material.

After forming the through hole, the above-described methods can further comprise forming a plurality of conductive elements on the redistribution layer, wherein the conductive elements are electrically connected to the sub-conductive wires. In the above-described methods, the seal ring can be made of polymer, eutectic metal alloy or glass frit, and the first wafer can be a pressure sensor wafer or a temperature sensor wafer.

The present invention further provides a package structure, which comprises: a wafer having opposite first and second surfaces, wherein the first surface of the wafer has a groove, a thin film closing an open end of the groove and a plurality of electrical contacts; a chip disposed on the first surface of the wafer, wherein the chip has a third surface with a conductive layer and an opposite fourth surface with a concave portion and a seal ring located at a periphery of the concave portion, the chip being disposed on the first surface of the wafer in a manner that the seal ring surrounds the thin film of the wafer and the electrical contacts are located outside the seal ring; an encapsulant formed on the first surface of the wafer for encapsulating the chip and the electrical contacts; a plurality of sub-conductive wires embedded in the encapsulant, wherein one ends of the sub-conductive wires are exposed from a top surface of the encapsulant and the other ends of sub-conductive wires are in electrical connection with the electrical contacts of the wafer; and a through hole penetrating the first surface and the second surface of the wafer and communicating with the concave portion of the chip.

The present invention provides another package structure, which comprises: a wafer having opposite first and second surfaces, wherein the first surface of the wafer has a groove, a thin film closing an open end of the groove and a plurality of electrical contacts; a chip disposed on the first surface of the wafer, wherein the chip has a third surface with a plurality of electrode pads and an opposite fourth surface with a concave portion and a seal ring located at a periphery of the concave portion, the chip being disposed on the first surface of the wafer in a manner that the seal ring surrounds the thin film of the wafer and the electrical contacts are located outside the seal ring; a lid member disposed on the third surface of the chip and having a conductive layer formed on a top surface thereof; an encapsulant formed on the first surface of the wafer for encapsulating the chip and the electrical contacts; a plurality of sub-conductive wires embedded in the encapsulant, wherein one ends of the sub-conductive wires are exposed from a top surface of the encapsulant and the other ends of sub-conductive wires are in electrical connection with the electrical contacts of the wafer; a plurality of conductive wires embedded in the encapsulant for electrically connecting the electrical contacts of the wafer and the electrode pads of the chip; and a through hole penetrating the first surface and the second surface of the wafer and communicating with the concave portion of the chip.

In the above-described package structure, the chip can be a motion sensor.

The above-described two package structures can further comprise a redistribution layer formed on the encapsulant and electrically connected to the sub-conductive wires. The above-described package structures can further comprise a plurality of conductive elements formed on the redistribution layer and electrically connected to the sub-conductive wires.

In the above-described package structures, the wafer can be a pressure sensor wafer or a temperature sensor wafer, and the seal ring can be made of polymer, eutectic metal alloy or glass frit.

Therefore, the present invention eliminates the need to form through holes penetrating a silicon substrate as in the prior art, thereby reducing equipment and fabrication costs. Further, the present invention can integrate two types of sensors in a SiP (System in Package) package so as to achieve low power consumption, low cost and high performance. Furthermore, the package structure of the present invention has a reduced size so as to meet the miniaturization requirement.

DETAILED DESCRIPTION OF PREFERRED EMBODIMENTS

The following illustrative embodiments are provided to illustrate the disclosure of the present invention, these and other advantages and effects can be apparent to those in the art after reading this specification.

It should be noted that all the drawings are not intended to limit the present invention. Various modifications and variations can be made without departing from the spirit of the present invention. Further, terms such as "first", "second", "top", "on", "a" etc. are merely for illustrative purposes and should not be construed to limit the scope of the present invention.

First Embodiment

FIGS. 3A to 3J are schematic cross-sectional views showing a package structure and a fabrication method thereof according to a first embodiment of the present invention.

Figure 1:
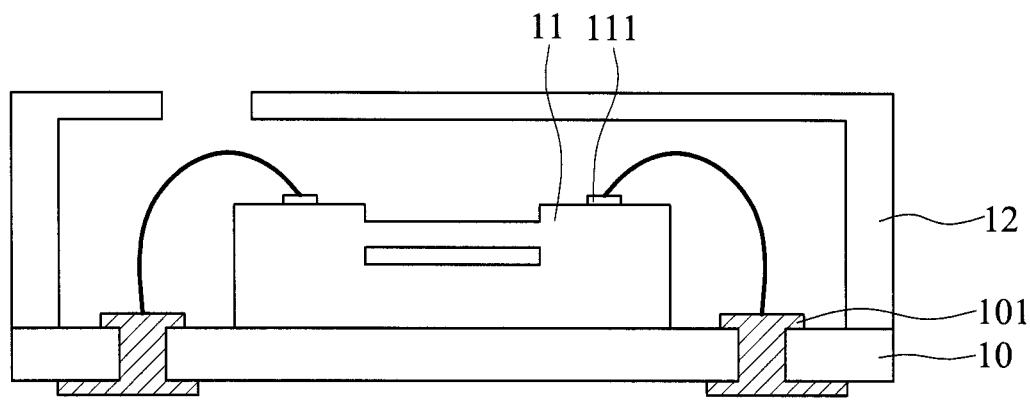
FIG. 1 is a schematic cross-sectional view of a conventional package structure having a MEMS element.
Figure 2:
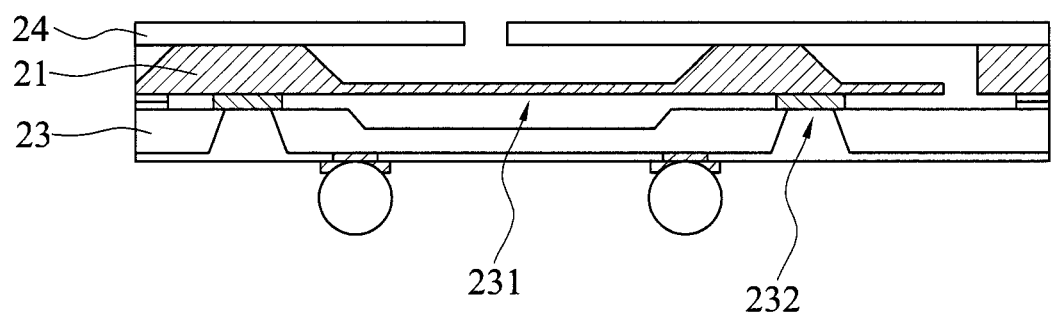
FIG. 2 is a schematic cross-sectional view of another conventional package structure having a MEMS element.
Figure 3A:
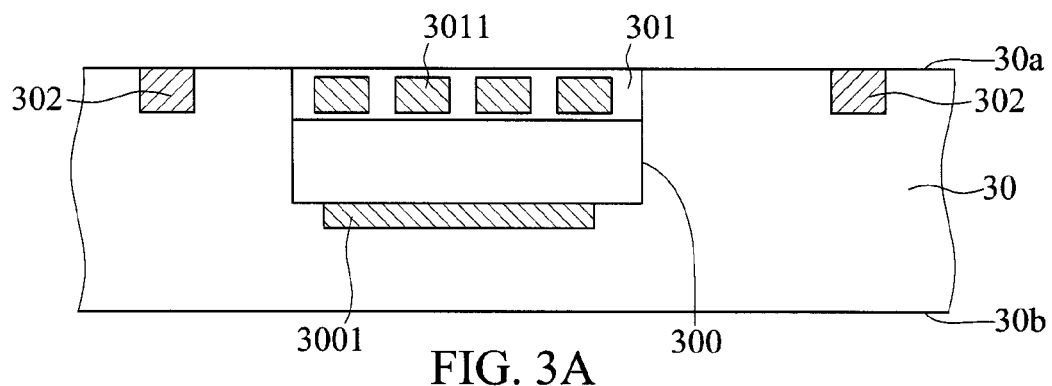
FIGS. 3A to 3J are schematic cross-sectional views showing a package structure and a fabrication method thereof according to a first embodiment of the present invention.

Referring to FIG. 3A, a first wafer 30 having opposite first and second surfaces 30a, 30b is provided. The first surface 30a of the first wafer 30 has a groove 300, a thin film 301 closing an open end of the groove 300, and a plurality of electrical contacts 302. A plurality of upper electrodes 3011 are formed in the thin film 301 and a plurality of lower electrodes 3001 are formed on a bottom of the groove 300. The first wafer 30 can be a pressure or temperature sensor wafer having a MEMS element. The closed groove 300 is in a vacuum state.

Figure 3B:
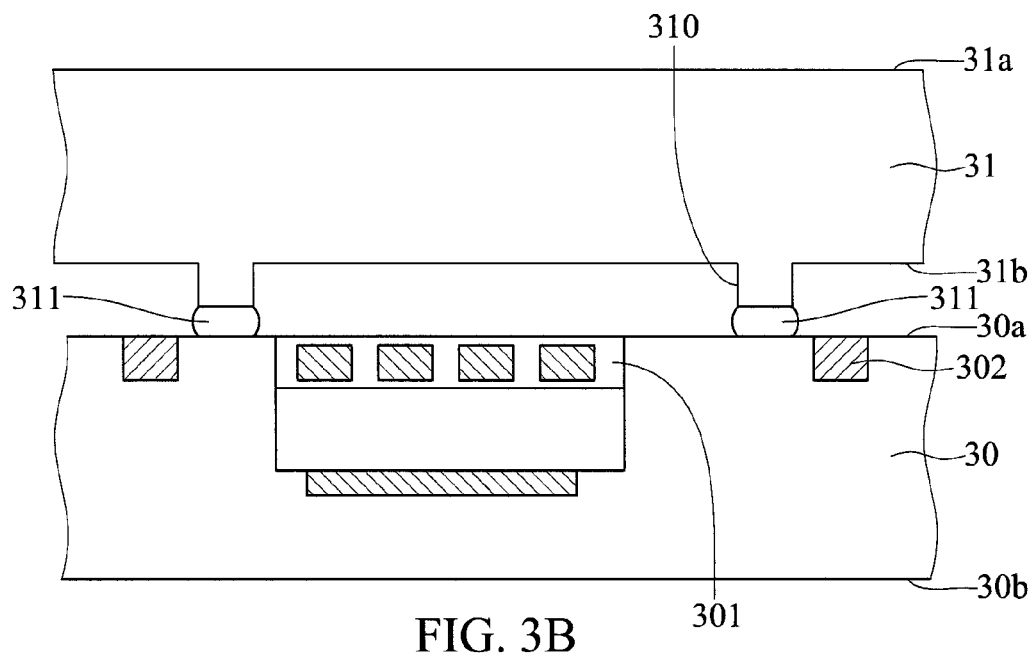

Referring to FIG. 3B, a second wafer 31 is disposed on the first wafer 30. The second wafer 31 has opposite third and fourth surfaces 31a, 31b, and the fourth surface 31b of the second wafer 31 has a concave portion 310 and a seal ring 311 located at a periphery of the concave portion 310. The second wafer 31 is disposed on the first surface 30a of the first waver 30 in a manner that the seal ring 311 surrounds the thin film 301 of the first wafer 30 and the electrical contacts 302 are located outside the seal ring 311. The seal ring 311 can be made of polymer, eutectic metal alloy or glass frit.

Figure 3C:
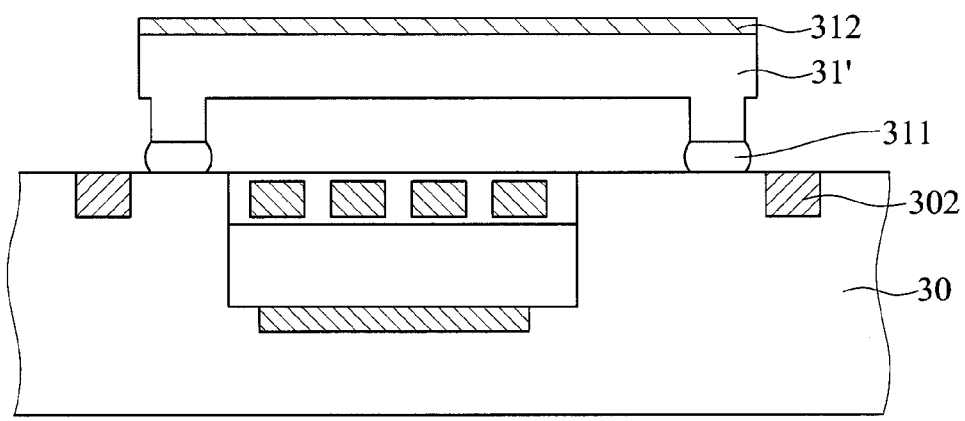

Referring to FIG. 3C, the second wafer 31 is thinned by, for example, grinding. Then, a conductive layer 312 is formed on the third surface 31a of the second wafer 31 to facilitate a subsequent wire bonding process. Thereafter, a portion of the second wafer 31 is removed by etching to form a chip 31'.

Figure 3D:
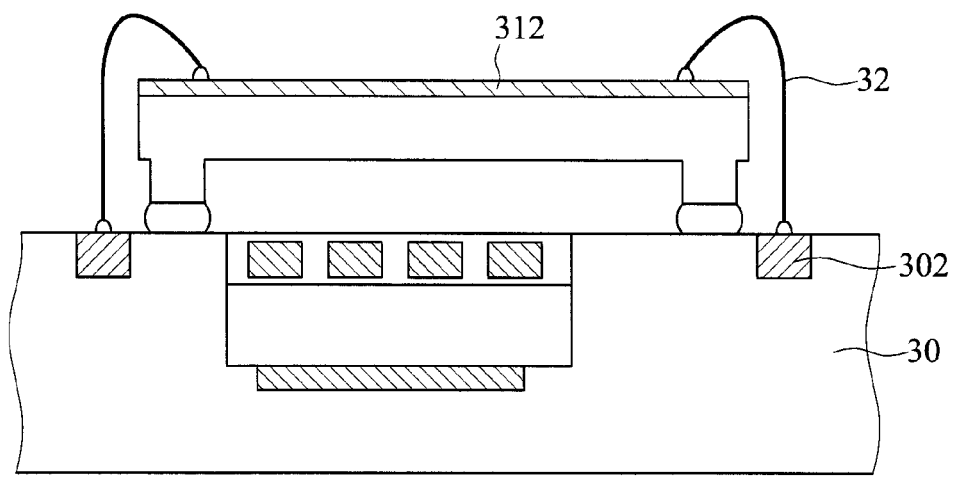

Referring to FIG. 3D, a plurality of first conductive wires 32 are formed to electrically connect the electrical contacts 302 of the first wafer 30 and the conductive layer 312 of the chip 31'.

Figure 3E:
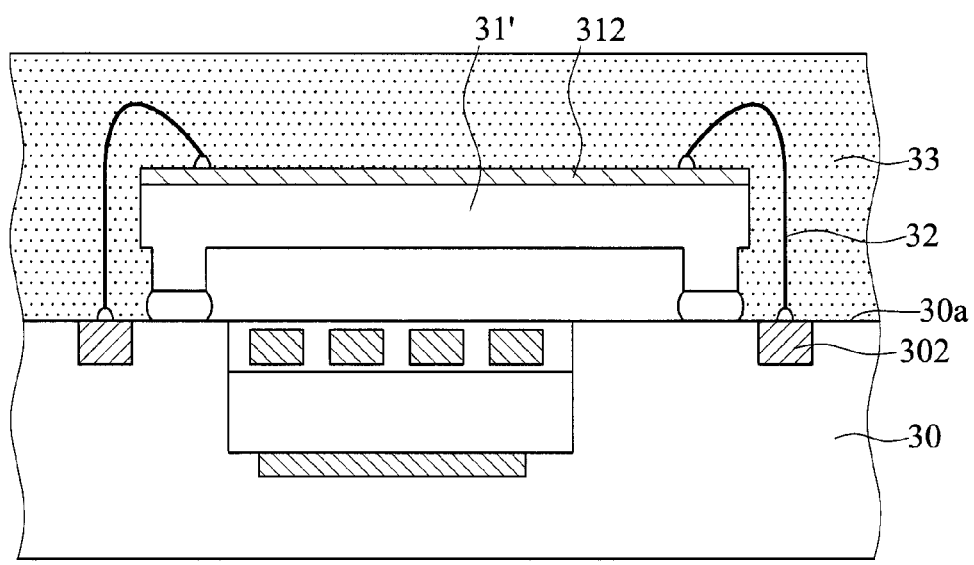

Referring to FIG. 3E, an encapsulant 33 is formed on the first surface 30a of the first wafer 30 for encapsulating the chip 31', the electrical contacts 302 and the first conductive wires 32.

Figure 3F:
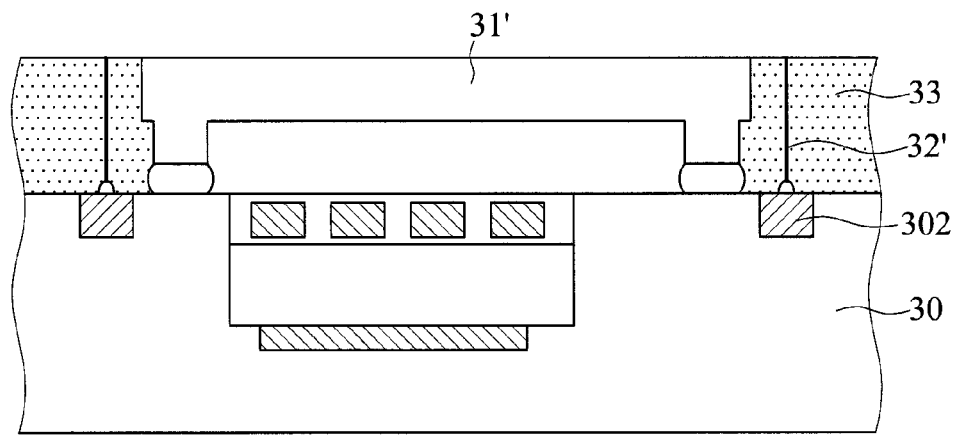

Referring to FIG. 3F, a portion of the encapsulant 33 and a portion of the first conductive wires 32 are removed from a top surface of the encapsulant 33 by, for example, grinding so as to form a plurality of sub-conductive wires 32'. One ends of the sub-conductive wires 32' are exposed from the top surface of the encapsulant 33 and the other ends of the sub-conductive wires 32' are in electrical connection with the electrical contacts 302. In the present embodiment, the conductive layer 312 can also be removed to expose the chip 31', but it is not necessary.

Figure 3G:
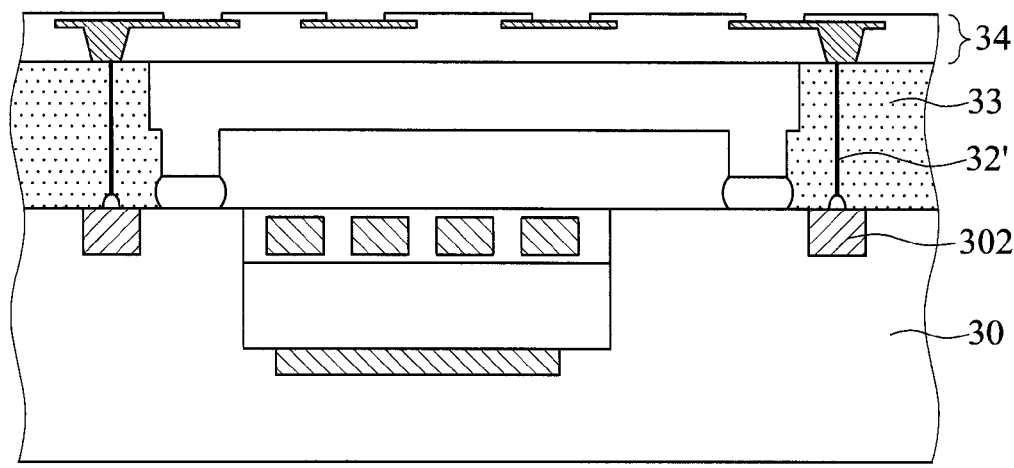

Referring to FIG. 3G, a redistribution layer 34 is formed on the encapsulant 33 and electrically connected to the sub-conductive wires 32' so as to meet fan-out or fan-in requirements of conductive pads.

Figure 3H:
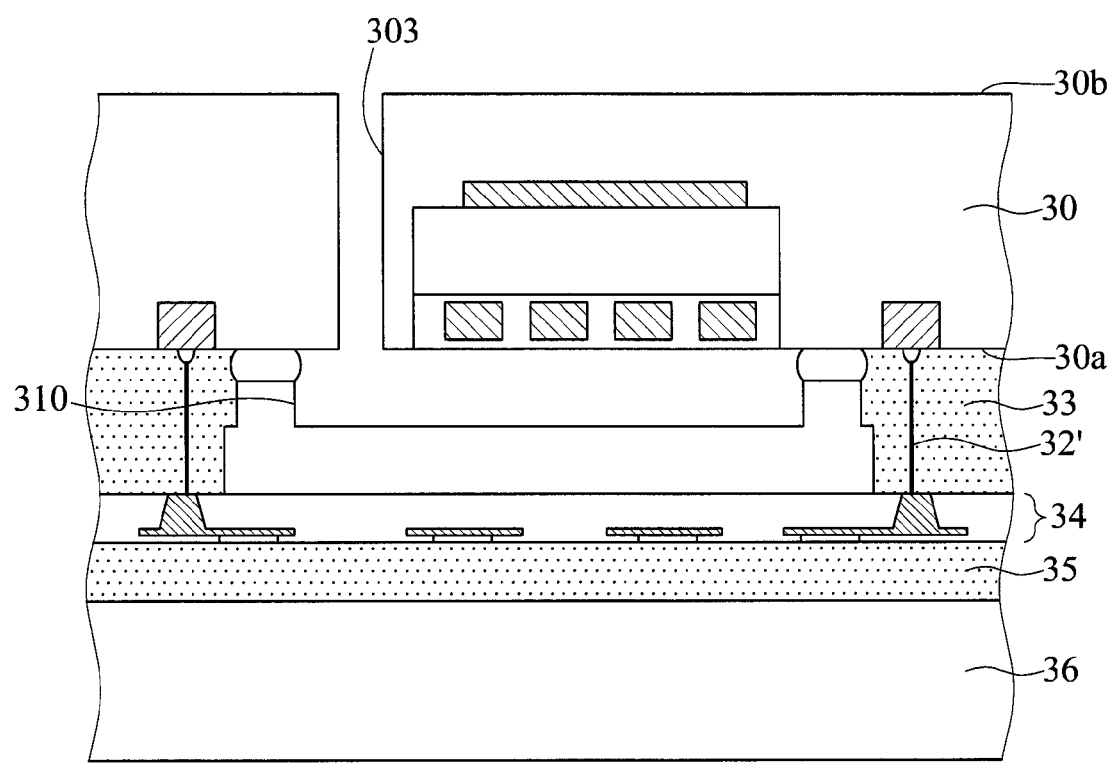

Referring to FIG. 3H, a carrier 36 is mounted on the redistribution layer 34 through an adhesive layer 35. The carrier 36 is made of a transparent material. Then, the overall structure is turned upside down. A double side aligner (not shown) is used to assist positioning and exposure, and a dry etching technique such as DRIE (Deep Reactive Ion Etching) is used to form a through hole 303 penetrating the first surface 30a and the second surface 30b of the first wafer 30 and communicating with the concave portion 310. Before forming the through hole 303, a portion of the first wafer 30 can be removed by grinding according to the practical need (not shown).

Figure 3I:
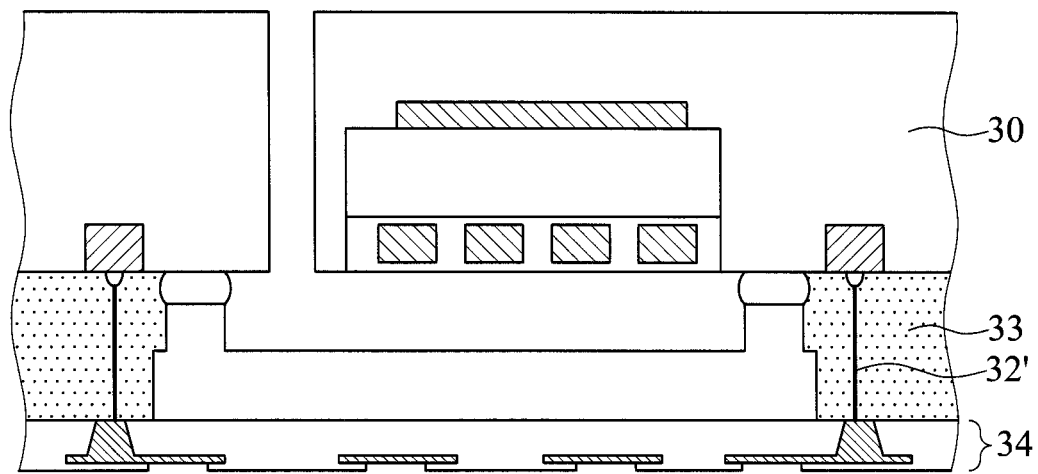

Referring to FIG. 3I, the adhesive layer 35 and the carrier 36 are removed.

Figure 3J:
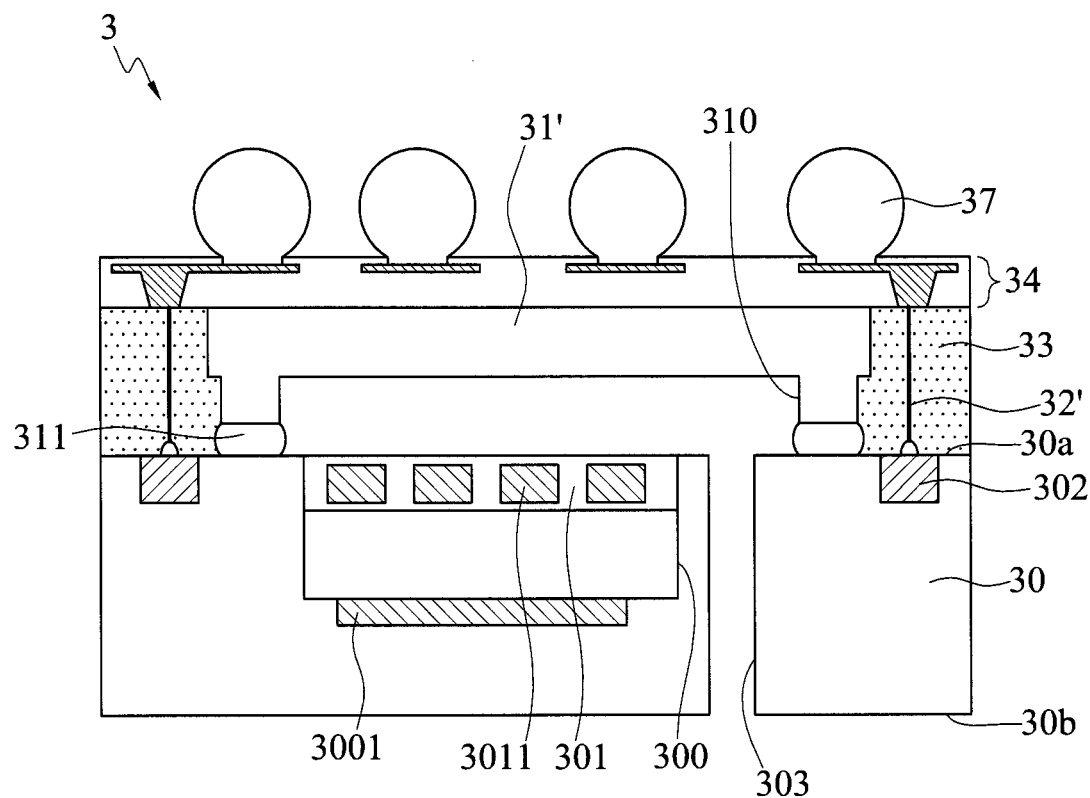

Referring to FIG. 3J, a plurality of conductive elements 37 are formed on the redistribution layer 34 and electrically connected to the sub-conductive wires 32'. The conductive elements 37 can be, for example, solder balls. Further, a singulation process is performed to form a package structure 3.

Second Embodiment

FIGS. 4A to 4I are schematic cross-sectional views showing a package structure and a fabrication method thereof according to a second embodiment of the present invention.

Figure 4A:
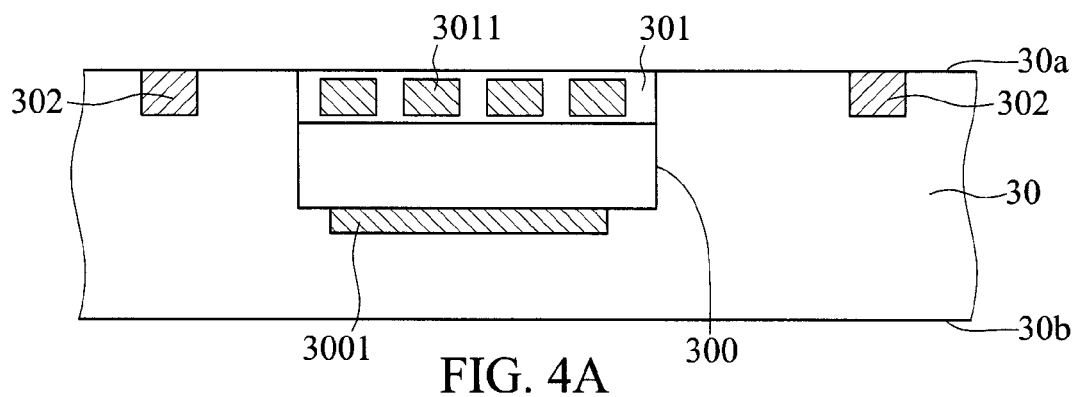
FIGS. 4A to 4I are schematic cross-sectional views showing a package structure and a fabrication method thereof according to a second embodiment of the present invention.

Referring to FIG. 4A, a first wafer 30 having opposite first and second surfaces 30a, 30b is provided. The first surface 30a of the first wafer 30 has a groove 300, a thin film 301 closing an open end of the groove 300, and a plurality of electrical contacts 302. A plurality of upper electrodes 3011 are formed in the thin film 301 and a plurality of lower electrodes 3001 are formed on a bottom of the groove 300. The first wafer 30 can be a pressure or temperature sensor wafer having a MEMS element. The closed groove 300 is in a vacuum state.

Figure 4B:
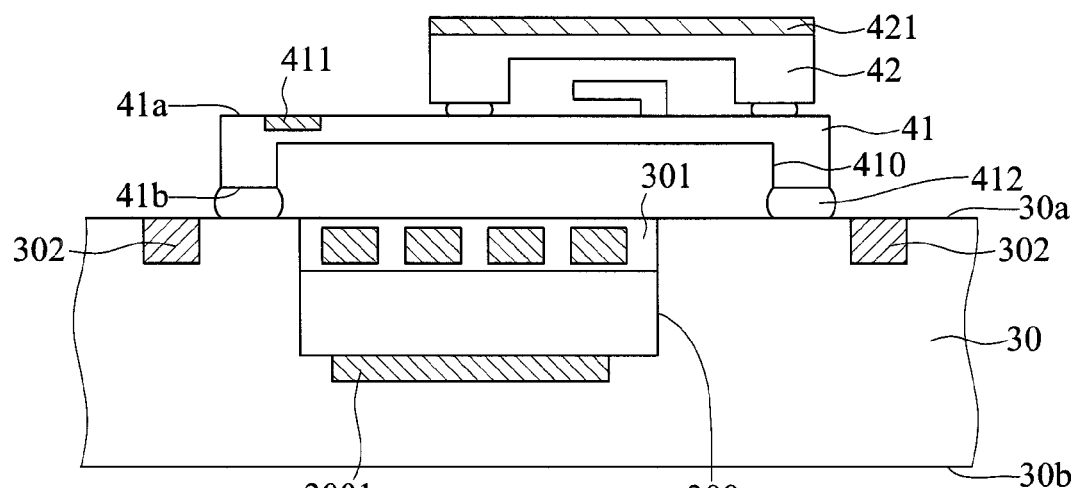

Referring to FIG. 4B, a chip 41 is disposed on the first wafer 30. The chip 41 can be a motion sensor. The chip 41 has a third surface 41a with a plurality of electrode pads 411 and an opposite fourth surface 41b with a concave portion 410 and a seal ring 412 located at a periphery of the concave portion 410. A lid member 42 is disposed on the third surface 41a of the chip 41. Further, the lid member 42 has a conductive layer 421 formed on a top surface thereof so as to facilitate a subsequent wire bonding process. The chip 41 is disposed on the first surface 30a of the first wafer 30 in a manner that the seal ring 412 surrounds the thin film 301 of the first wafer 30 and the electrical contacts 302 are located outside the seal ring 412. The seal ring 412 can be made of polymer, eutectic metal alloy or glass frit.

Figure 4C:
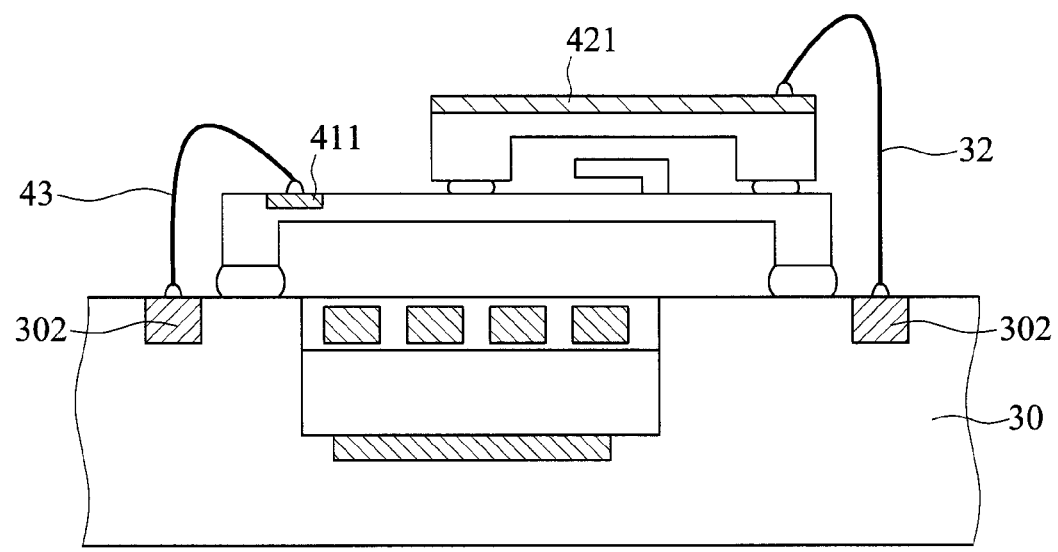

Referring to FIG. 4C, a plurality of first conductive wires 32 are formed to electrically connect the electrical contacts 302 of the first wafer 30 and the conductive layer 421 of the lid member 42, and a plurality of second conductive wires 43 are formed to electrically connect the electrical contacts 302 of the first wafer 30 and the electrode pads 411 of the chip 41.

Figure 4D:
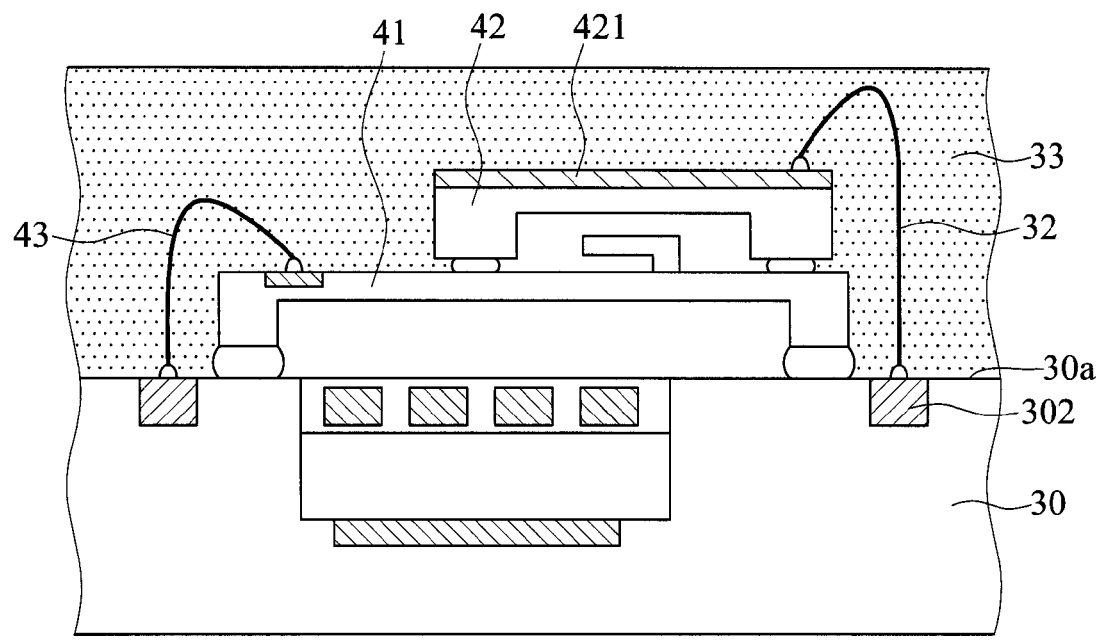

Referring to FIG. 4D, an encapsulant 33 is formed on the first surface 30a of the first wafer 30 for encapsulating the chip 41, the lid member 42, the electrical contacts 302, the first conductive wires 32 and the second conductive wires 43.

Figure 4E:
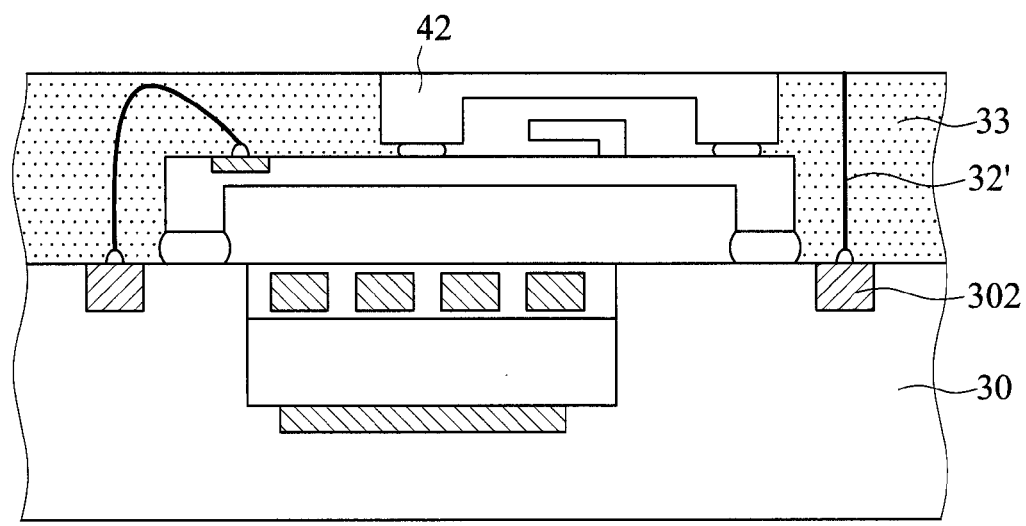

Referring to FIG. 4E, a portion of the encapsulant 33 and a portion of the first conductive wires 32 are removed from a top surface of the encapsulant 33 by, for example, grinding so as to form a plurality of sub-conductive wires 32'. One ends of the sub-conductive wires 32' are exposed from the top surface of the encapsulant 33 and the other ends of the sub-conductive wires 32' are in electrically connection with the electrical contacts 302. In the present embodiment, the conductive layer 421 can also be removed to expose the lid member 42, but it is not necessary.

Figure 4F:
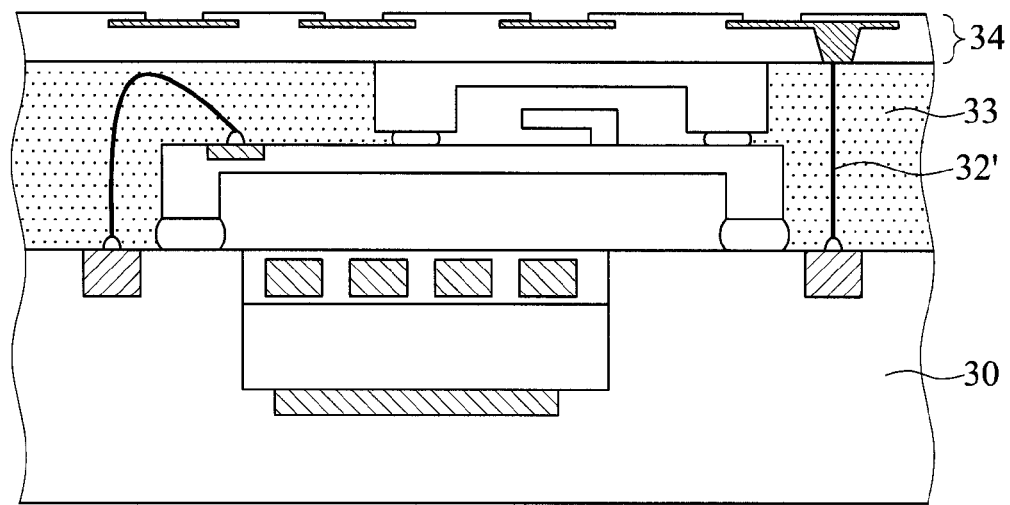

Referring to FIG. 4F, a redistribution layer 34 is formed on the encapsulant 33 and electrically connected to the sub-conductive wires 32' so as to meet fan-out or fan-in requirements of conductive pads.

Figure 4G:
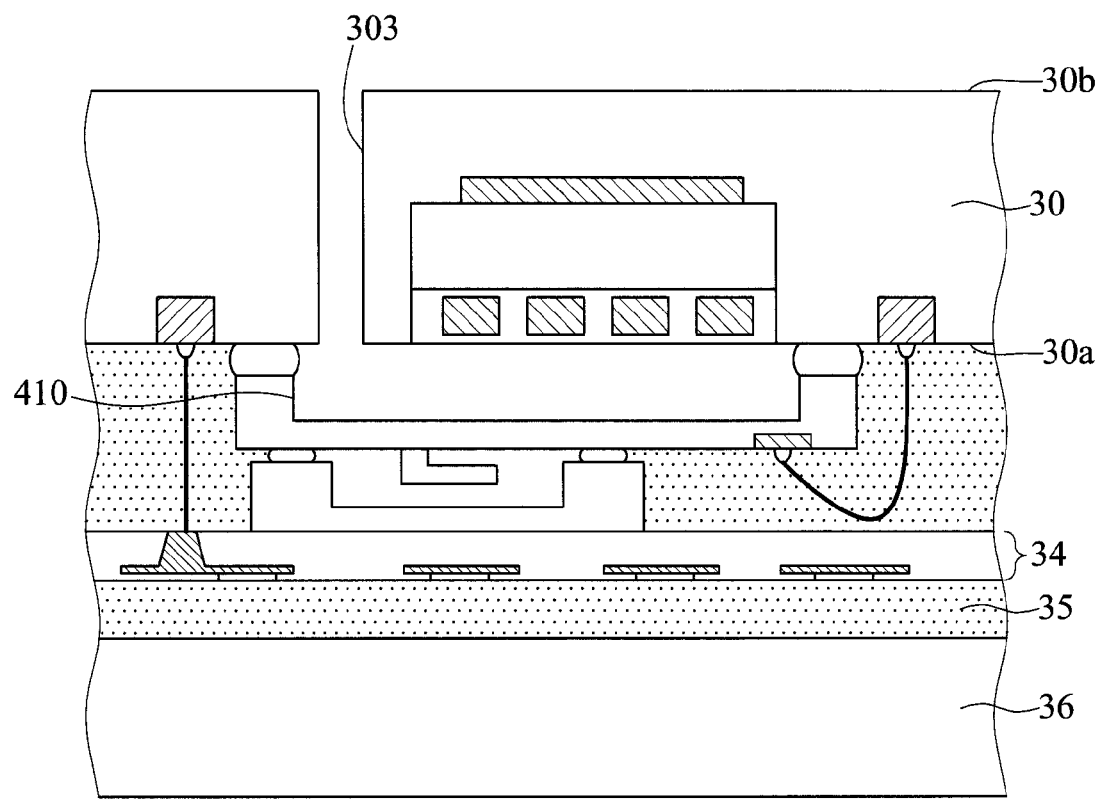

Referring to FIG. 4G, a carrier 36 is mounted on the redistribution layer 34 through an adhesive layer 35. The carrier 36 is made of a transparent material. Then, the overall structure is turned upside down. A double side aligner (not shown) is used to assist positioning and exposure, and a dry etching technique such as DRIE is used to form a through hole 303 penetrating the first surface 30a and the second surface 30b of the first wafer 30 and communicating with the concave portion 310. Before forming the through hole 303, a portion of the first wafer 30 can be removed by grinding according to the practical need (not shown).

Figure 4H:
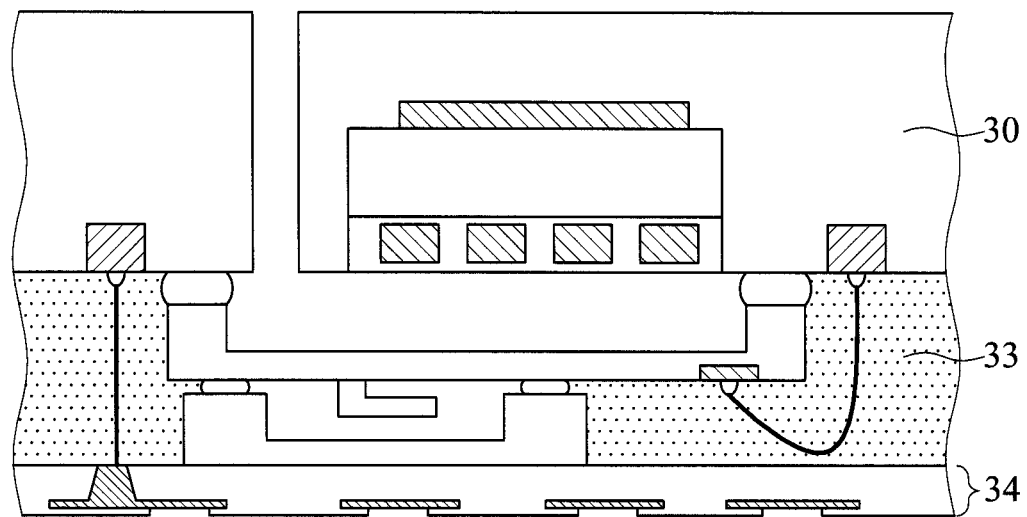

Referring to FIG. 4H, the adhesive layer 35 and the carrier 36 are removed.

Figure 4I:
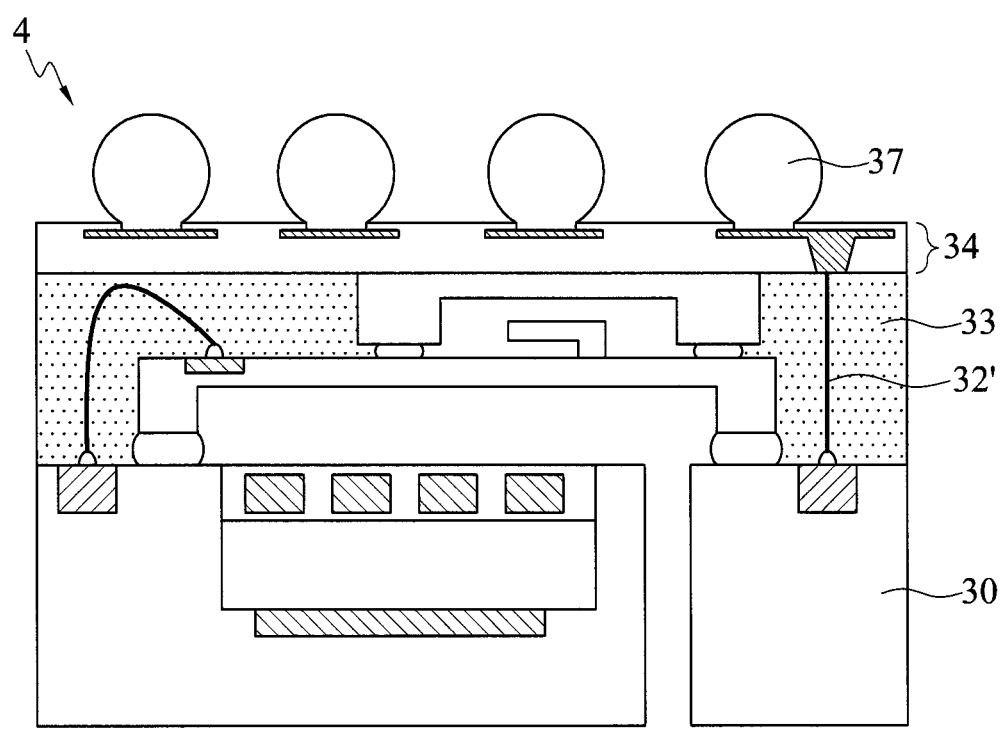

Referring to FIG. 4I, a plurality of conductive elements 37 are formed on the redistribution layer 34 and electrically connected to the sub-conductive wires 32'. The conductive elements 37 can be, for example, solder balls. Further, a singulation process is performed to form a package structure 4.

The present invention further provides a package structure 3, which has: a first wafer 30 having opposite first and second surfaces 30a, 30b, wherein the first surface 30a of the first wafer 30 has a groove 300, a thin film 301 closing an open end of the groove 300 and a plurality of electrical contacts 302; a chip 31' disposed on the first surface 30a of the first wafer 30, wherein the chip 31' has a third surface 31a with a conductive layer 312 and an opposite fourth surface 31b with a concave portion 310 and a seal ring 311 located at a periphery of the concave portion 310, the chip 31' being disposed on the first surface 30a of the first wafer 30 in a manner that the seal ring 311 surrounds the thin film 301 of the first wafer 30 and the electrical contacts 302 are located outside the seal ring 311; an encapsulant 33 formed on the first surface 30a of the first wafer 30 for encapsulating the chip 31' and the electrical contacts 302; a plurality of sub-conductive wires 32' embedded in the encapsulant 33, wherein one ends of the sub-conductive wires 32' are exposed from a top surface of the encapsulant 33 and the other ends of sub-conductive wires 32' are in electrical connection with the electrical contacts 302 of the first wafer 30; and a through hole 303 penetrating the first surface 30a and the second surface 30b of the first wafer 30 and communicating with the concave portion 310 of the chip 31'.

The present invention further provides another package structure 4, which has: a first wafer 30 having opposite first and second surfaces 30a. 30b, wherein the first surface 30a of the first wafer 30 has a groove 300, a thin film 301 closing an open end of the groove 300 and a plurality of electrical contacts 302; a chip 41 disposed on the first surface 30a of the first wafer 30, wherein the chip 41 has a third surface 41a with a plurality of electrode pads 411 and an opposite fourth surface 41b with a concave portion 410 and a seal ring 412 located at a periphery of the concave portion 410, the chip 41 being disposed on the first surface 30a of the first wafer 30 in a manner that the seal ring 412 surrounds the thin film 301 of the first wafer 30 and the electrical contacts 302 are located outside the seal ring 412; a lid member 42 disposed on the third surface 41a of the chip 41 and having a conductive layer 421 formed on a top surface thereof; an encapsulant 33 formed on the first surface 30a of the first wafer 30 for encapsulating the chip 41 and the electrical contacts 302; a plurality of sub-conductive wires 32' embedded in the encapsulant 33, wherein one ends of the sub-conductive wires 32' are exposed from a top surface of the encapsulant 33 and the other ends of sub-conductive wires 32' are in electrical connection with the electrical contacts 302 of the first wafer 30; a plurality of conductive wires 43 embedded in the encapsulant 33 for electrically connecting the electrical contacts 302 of the first wafer 30 and the electrode pads 411 of the chip 41; and a through hole 303 penetrating the first surface 30a and the second surface 30b of the first wafer 30 and communicating with the concave portion 410 of the chip 41.

The above-described package structures can further have a redistribution layer 34 formed on the encapsulant 33 and electrically connected to the sub-conductive wires 32', and a plurality of conductive elements 37 formed on the redistribution layer 34 and electrically connected to the sub-conductive wires 32'.

In the above-described package structures, the first wafer 30 can be a pressure sensor wafer or a temperature sensor wafer, the chip 42 can be a motion sensor, and the seal ring 311, 412 can be made of polymer, eutectic metal alloy or glass frit.

Therefore, the present invention eliminates the need to form through holes penetrating a silicon substrate as in the prior art, thereby reducing equipment and fabrication costs. Further, the present invention can integrate two types of sensors (for example, a pressure sensor and a motion sensor) in a SiP (System in Package) package so as to achieve low power consumption, low cost and high performance. Furthermore, the package structure of the present invention has a reduced size so as to meet the miniaturization requirement.

The above-described descriptions of the detailed embodiments are only to illustrate the preferred implementation according to the present invention, and it is not to limit the scope of the present invention. Accordingly, all modifications and variations completed by those with ordinary skill in the art should fall within the scope of present invention defined by the appended claims.

What is claimed is:

1. A method for fabricating a package structure, comprising the steps of:
preparing a first wafer and a chip disposed on the first wafer, wherein the first wafer has opposite first and second surfaces and the first surface of the first wafer has a groove, a thin film closing an open end of the groove and a plurality of electrical contacts, and the chip has a third surface with a conductive layer, an opposite fourth surface with a concave portion and a seal ring located at a periphery of the concave portion, the chip being disposed on the first surface of the first wafer in a manner that the seal ring surrounds the thin film of the first wafer and the electrical contacts are located outside the seal ring;
electrically connecting the electrical contacts of the first wafer and the conductive layer of the chip through a plurality of first conductive wires;
forming an encapsulant on the first surface of the first wafer for encapsulating the chip, the electrical contacts and the first conductive wires;
removing a portion of the encapsulant and a portion of the first conductive wires from a top surface of the encapsulant so as to form a plurality of sub-conductive wires, wherein one ends of the sub-conductive wires are exposed from the encapsulant and the other ends of the sub-conductive wires are in electrical connection with the electrical contacts of the first wafer; and
forming a through hole penetrating the first surface and the second surface of the first wafer and communicating with the concave portion of the chip.

2. The method of claim 1, after forming the through hole, further comprising performing a singulation process.

3. The method of claim 1, wherein preparing the first wafer and the chip comprises:
preparing the first wafer and a second wafer disposed on the first wafer;
thinning the second wafer;
forming the conductive layer on the second wafer; and
removing a portion of the second wafer to form the chip.

4. The method of claim 1, after forming the sub-conductive wires, further comprising forming a redistribution layer on the encapsulant, wherein the redistribution layer is electrically connected to the sub-conductive wires.

5. The method of claim 4, before forming the through hole, further comprising mounting a carrier on the redistribution layer, and after forming the through hole, further comprising removing the carrier.

6. The method of claim 5, wherein the carrier is made of a transparent material.

7. The method of claim 4, after forming the through hole, further comprising forming a plurality of conductive elements on the redistribution layer, wherein the conductive elements are electrically connected to the sub-conductive wires.

8. The method of claim 1, wherein the seal ring is made of polymer, eutectic metal alloy or glass frit.

9. The method of claim 1, wherein the first wafer is a pressure sensor wafer or a temperature sensor wafer.

10. A method for fabricating a package structure, comprising the steps of:
preparing a first wafer, a chip disposed on the first wafer, and a lid member disposed on the chip, wherein the first wafer has opposite first and second surfaces and the first surface of the first wafer has a groove, a thin film closing an open end of the groove and a plurality of electrical contacts, and the chip has a third surface with a plurality of electrode pads and an opposite fourth surface with a concave portion and a seal ring located at a periphery of the concave portion, such that the chip is disposed on the first surface of the first wafer in a manner that the seal ring surrounds the thin film of the first wafer and the electrical contacts are located outside the seal ring, and the lid member is disposed on the third surface of the chip and has a conductive layer formed on a top surface thereof;
electrically connecting the electrical contacts of the first wafer and the conductive layer of the lid member through a plurality of first conductive wires, and electrically connecting the electrical contacts of the first wafer and the electrode pads of the chip through a plurality of second conductive wires;
forming an encapsulant on the first surface of the first wafer for encapsulating the chip, the lid member, the electrical contacts, the first conductive wires and the second conductive wires;
removing a portion of the encapsulant and a portion of the first conductive wires from a top surface of the encapsulant so as to form a plurality of sub-conductive wires, wherein one ends of the sub-conductive wires are exposed from the encapsulant and the other ends of the sub-conductive wires are in electrical connection with the electrical contacts of the first wafer; and
forming a through hole penetrating the first surface and the second surface of the first wafer and communicating with the concave portion of the chip.

11. The method of claim 10, after forming the through hole, further comprising performing a singulation process.

12. The method of claim 10, wherein preparing the first wafer and the chip comprises:
preparing the first wafer and a second wafer disposed on the first wafer;
thinning the second wafer; and
removing a portion of the second wafer to form the chip.

13. The method of claim 10, after forming the sub-conductive wires, further comprising forming a redistribution layer on the encapsulant, wherein the redistribution layer is electrically connected to the sub-conductive wires.

14. The method of claim 13, before forming the through hole, further comprising mounting a carrier on the redistribution layer, and after forming the through hole, further comprising removing the carrier.

15. The method of claim 14, wherein the carrier is made of a transparent material.

16. The method of claim 13, after forming the through hole, further comprising forming a plurality of conductive elements on the redistribution layer, wherein the conductive elements are electrically connected to the sub-conductive wires.

17. The method of claim 10, wherein the seal ring is made of polymer, eutectic metal alloy or glass frit.

18. The method of claim 10, wherein the first wafer is a pressure sensor wafer or a temperature sensor wafer.

19. The method of claim 10, wherein the chip is a motion sensor.

20. A package structure, comprising:
a wafer having opposite first and second surfaces, wherein the first surface of the wafer has a groove, a thin film closing an open end of the groove, and a plurality of electrical contacts, and wherein the thin film is coplanar with the first surface, and the groove is in a vacuum state;
a chip disposed on the first surface of the wafer, wherein the chip has a third surface with a conductive layer and an opposite fourth surface with a concave portion and a seal ring located at a periphery of the concave portion, the chip being disposed on the first surface of the wafer in a manner that the seal ring surrounds the thin film of the wafer and the electrical contacts are located outside the seal ring;
an encapsulant formed on the first surface of the wafer for encapsulating the chip and the electrical contacts;
a plurality of sub-conductive wires embedded in the encapsulant, wherein one ends of the sub-conductive wires are exposed from a top surface of the encapsulant and the other ends of sub-conductive wires are in electrical connection with the electrical contacts of the wafer; and
a through hole penetrating the first surface and the second surface of the wafer and communicating with the concave portion of the chip.

21. The structure of claim 20, further comprising a redistribution layer formed on the encapsulant and electrically connected to the sub-conductive wires.

22. The structure of claim 21, further comprising a plurality of conductive elements formed on the redistribution layer and electrically connected to the sub-conductive wires.

23. The structure of claim 20, wherein the wafer is a pressure sensor wafer or a temperature sensor wafer.

24. The structure of claim 20, wherein the seal ring is made of polymer, eutectic metal alloy or glass frit.

25. A package structure, comprising:
a wafer having opposite first and second surfaces, wherein the first surface of the wafer has a groove, a thin film closing an open end of the groove, and a plurality of electrical contacts, and wherein the thin film is coplanar with the first surface, and the groove is in a vacuum state;
a chip disposed on the first surface of the wafer, wherein the chip has a third surface with a plurality of electrode pads and an opposite fourth surface with a concave portion and a seal ring located at a periphery of the concave portion, the chip being disposed on the first surface of the wafer in a manner that the seal ring surrounds the thin film of the wafer and the electrical contacts are located outside the seal ring;
a lid member disposed on the third surface of the chip and having a conductive layer formed on a top surface thereof;
an encapsulant formed on the first surface of the wafer for encapsulating the chip and the electrical contacts;
a plurality of sub-conductive wires embedded in the encapsulant, wherein one ends of the sub-conductive wires are exposed from a top surface of the encapsulant and the other ends of sub-conductive wires are in electrical connection with the electrical contacts of the wafer;

a plurality of conductive wires embedded in the encapsulant for electrically connecting the electrical contacts of the wafer and the electrode pads of the chip; and a through hole penetrating the first surface and the second surface of the wafer and communicating with the concave portion of the chip.

26. The structure of claim 25, further comprising a redistribution layer formed on the encapsulant and electrically connected to the sub-conductive wires.

27. The structure of claim 26, further comprising a plurality of conductive elements formed on the redistribution layer and electrically connected to the sub-conductive wires.

28. The structure of claim 25, wherein the wafer is a pressure sensor wafer or a temperature sensor wafer.

29. The structure of claim 25, wherein the chip is a motion sensor.

30. The structure of claim 25, wherein the seal ring is made of polymer, eutectic metal alloy or glass frit.

* * * * *